US011069525B2

(12) United States Patent
Wildeson et al.

(10) Patent No.: US 11,069,525 B2
(45) Date of Patent: *Jul. 20, 2021

(54) METHODS FOR USING REMOTE PLASMA CHEMICAL VAPOR DEPOSITION (RP-CVD) AND SPUTTERING DEPOSITION TO GROW LAYERS IN LIGHT EMITTING DEVICES

(71) Applicant: Lumileds LLC, San Jose, CA (US)

(72) Inventors: Isaac Wildeson, San Jose, CA (US); Parijat Deb, San Jose, CA (US); Erik Charles Nelson, Pleasanton, CA (US); Junko Kobayashi, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/847,999

(22) Filed: Apr. 14, 2020

(65) Prior Publication Data
US 2020/0243331 A1 Jul. 30, 2020

Related U.S. Application Data

(63) Continuation of application No. 16/803,508, filed on Feb. 27, 2020, which is a continuation of application
(Continued)

(51) Int. Cl.
*H01L 21/02* (2006.01)
*H01L 33/02* (2010.01)
(Continued)

(52) U.S. Cl.
CPC .... *H01L 21/02274* (2013.01); *H01L 21/0228* (2013.01); *H01L 21/02266* (2013.01);
(Continued)

(58) Field of Classification Search
CPC ........... H01L 21/02274; H01L 33/0062; H01L 21/0228; H01L 33/0075; H01L 33/005;
(Continued)

(56) References Cited

U.S. PATENT DOCUMENTS 8,039,352 B2   10/2011   Mishra et al.
8,154,052 B2   4/2012    Gardner et al.
(Continued)

FOREIGN PATENT DOCUMENTS

KR   20050028644 A   3/2005

OTHER PUBLICATIONS

"RPCVD For LED Manufacturers", Available at: https://www.bluglas.com.au/rpcvd-for-led, For the record, the web article was published 2018.
(Continued)

*Primary Examiner* — Eduardo A Rodela
(74) *Attorney, Agent, or Firm* — Servilla Whitney LLC (57) ABSTRACT

Described herein are methods for using remote plasma chemical vapor deposition (RP-CVD) and sputtering deposition to grow layers for light emitting devices. A method includes growing a light emitting device structure on a growth substrate, and growing a tunnel junction on the light emitting device structure using at least one of RP-CVD and sputtering deposition. The tunnel junction includes a p++ layer in direct contact with a p-type region, where the p++ layer is grown by using at least one of RP-CVD and sputtering deposition. Another method for growing a device includes growing a p-type region over a growth substrate using at least one of RP-CVD and sputtering deposition, and growing further layers over the p-type region. Another method for growing a device includes growing a light emitting region and an n-type region using at least one of RP-CVD and sputtering deposition over a p-type region.

15 Claims, 4 Drawing Sheets

Related U.S. Application Data

No. 16/274,778, filed on Feb. 13, 2019, now Pat. No. 10,622,206, which is a continuation of application No. 15/600,368, filed on May 19, 2017, now Pat. No. 10,236,409.

(60) Provisional application No. 62/339,412, filed on May 20, 2016.

(51) Int. Cl.

| | | |
|---|---|---|
| *H01L 29/88* | (2006.01) | |
| *H01L 33/04* | (2010.01) | |
| *H01L 29/66* | (2006.01) | |
| *H01L 33/00* | (2010.01) | |
| *H01L 21/203* | (2006.01) | |
| *H01L 33/06* | (2010.01) | |
| *H01L 33/32* | (2010.01) | |

(52) U.S. Cl.
CPC ...... *H01L 21/02271* (2013.01); *H01L 21/203* (2013.01); *H01L 29/66151* (2013.01); *H01L 29/66219* (2013.01); *H01L 29/88* (2013.01); *H01L 29/882* (2013.01); *H01L 33/005* (2013.01); *H01L 33/007* (2013.01); *H01L 33/0062* (2013.01); *H01L 33/0075* (2013.01); *H01L 33/0095* (2013.01); *H01L 33/02* (2013.01); *H01L 33/04* (2013.01); *H01L 33/06* (2013.01); *H01L 21/0254* (2013.01); *H01L 21/0262* (2013.01); *H01L 21/02458* (2013.01); *H01L 21/02576* (2013.01); *H01L 21/02579* (2013.01); *H01L 21/02631* (2013.01); *H01L 33/0025* (2013.01); *H01L 33/325* (2013.01)

(58) Field of Classification Search
CPC ..... H01L 33/0095; H01L 33/02; H01L 29/88; H01L 21/02271; H01L 33/04; H01L 29/66219; H01L 29/882; H01L 29/66151; H01L 33/06; H01L 33/007; H01L 21/02458; H01L 21/02576; H01L 21/02631; H01L 33/0025; H01L 21/0254; H01L 21/02579; H01L 21/0262; H01L 33/325; H01L 21/02266; H01L 21/324; H01L 33/0008; H01L 33/32; H01L 33/36; H01L 33/62; H01L 21/02263; H01L 21/02361; H01L 21/203

See application file for complete search history.

(56) References Cited

U.S. PATENT DOCUMENTS

| | | | |
|---|---|---|---|
| 8,487,344 | B2 | 7/2013 | Seong |
| 8,581,264 | B2 | 11/2013 | Strassburg et al. |
| 9,716,209 | B2 | 7/2017 | Takeuchi et al. |
| 10,236,409 | B2 * | 3/2019 | Wildeson ............ H01L 33/0095 |
| 10,355,165 | B2 | 7/2019 | Mann et al. |
| 10,622,206 | B2 * | 4/2020 | Wildeson ............ H01L 33/0062 |
| 2008/0217646 | A1 | 9/2008 | Komada |
| 2009/0191659 | A1 | 7/2009 | Song |
| 2010/0314643 | A1 | 12/2010 | Lin |
| 2011/0027973 | A1 | 2/2011 | Su et al. |
| 2012/0153254 | A1 | 6/2012 | Mastro |
| 2012/0204957 | A1 | 8/2012 | Nicholls et al. |
| 2013/0016752 | A1 | 1/2013 | Lell et al. |
| 2013/0026484 | A1 | 1/2013 | Walukiewicz et al. |
| 2013/0248818 | A1 | 9/2013 | Choi et al. |
| 2014/0037865 | A1 | 2/2014 | Butcher |
| 2015/0167162 | A1 | 6/2015 | Barik et al. |
| 2016/0005909 | A1 | 1/2016 | Newman |
| 2016/0197151 | A1 | 7/2016 | Han et al. |

OTHER PUBLICATIONS

Krishnamoorthy, et al., "Low resistance GaN/InGaN/GaN tunnel junctions", Applied Physics Letters, American Institute of Physics (2013).

* cited by examiner

METHODS FOR USING REMOTE PLASMA CHEMICAL VAPOR DEPOSITION (RP-CVD) AND SPUTTERING DEPOSITION TO GROW LAYERS IN LIGHT EMITTING DEVICES

CROSS REFERENCE TO RELATED APPLICATIONS

This application is a continuation of U.S. Non-Provisional application Ser. No. 16/803,508 filed on Feb. 27, 2020, which is a continuation of U.S. Non-Provisional application Ser. No. 16/274,778, filed on Feb. 13, 2019, issued as U.S. Pat. No. 10,622,206 on Apr. 14, 2020, which is a continuation of U.S. Non-Provisional application Ser. No. 15/600,368 filed on May 19, 2017, issued as U.S. Pat. No. 10,236,409 on Mar. 19, 2019, which claims priority to U.S. Provisional Application No. 62/339,412 filed on May 20, 2016, the content of which is hereby incorporated by reference herein as if fully set forth.

FIELD OF INVENTION

This application is related to light emitting devices.

BACKGROUND

Semiconductor light-emitting devices including light emitting diodes (LEDs), resonant cavity light emitting diodes (RCLEDs), vertical-cavity surface-emitting laser (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

In commercial III-nitride LEDs, the semiconductor structure is typically grown by MOCVD. The nitrogen source used during MOCVD is typically ammonia. When ammonia dissociates, hydrogen is produced. The hydrogen forms a complex with magnesium, which is used as the p-type dopant during growth of p-type materials. The hydrogen complex deactivates the p-type character of the magnesium, effectively reducing the dopant concentration of the p-type material, which reduces the efficiency of the device. After growth of the p-type material, the structure is annealed in order to break the hydrogen-magnesium complex by driving off the hydrogen.

SUMMARY

Described herein are methods for using remote plasma chemical vapor deposition (RP-CVD) and sputtering deposition to grow layers for light emitting devices. A method includes growing a light emitting device structure on a growth substrate, and growing a tunnel junction on the light emitting device structure using at least one of RP-CVD and sputtering deposition. The light emitting device structure includes a n-type region, a light emitting region and a p-type region. The tunnel junction includes a p++ layer in direct contact with the p-type region and a n++ layer in direct contact with the p++ layer, where the p++ layer is grown by using at least one of RP-CVD and sputtering deposition. Another method for growing a device includes growing a p-type region over a growth substrate using at least one of RP-CVD and sputtering deposition, growing a light emitting region over the p-type region, and growing an n-type region over the light emitting region, where the p-type region, the light emitting region and the n-type region are made from III-nitride materials. Another method for growing a device includes growing a p-type region over a growth substrate, growing a light emitting region over the p-type region, and growing an n-type region over the light emitting region, where at least one of the light emitting region and the n-type region is grown using at least one of RP-CVD and sputtering deposition.

BRIEF DESCRIPTION OF THE DRAWINGS

A more detailed understanding may be had from the following description, given by way of example in conjunction with the accompanying drawings wherein.

DETAILED DESCRIPTION

It is to be understood that the figures and descriptions for a method for using at least one of remote plasma chemical vapor deposition (RP-CVD) and sputtering deposition to grow layers in light emitting devices have been simplified to illustrate elements that are relevant for a clear understanding, while eliminating, for the purpose of clarity, many other elements found in typical device processing. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

In conventional III-nitride light emitting diodes (LEDs), a n-type region is grown first on a substrate, followed by an active region (or light emitting region) and a p-type region. As used herein, the term region refers to at least one layer of the identified region, e.g. a n-type region can include one or more n-type layers. The internal field of a III-nitride LED grown n-side down device increases with increasing forward bias. As a result, as the device bias (current) is increased, the internal electric field increases, reducing electron-hole overlap and thereby reducing radiative efficiency. Growing the device (e.g. LED) in the reverse order, with the p-type region grown first on the substrate, reverses the internal field. In a III-nitride LED grown p-side down device, the internal field is opposite the built-in polarization field. As a result, as the forward bias (current) increases, the radiative efficiency of such a device may increase.

Figure 1:
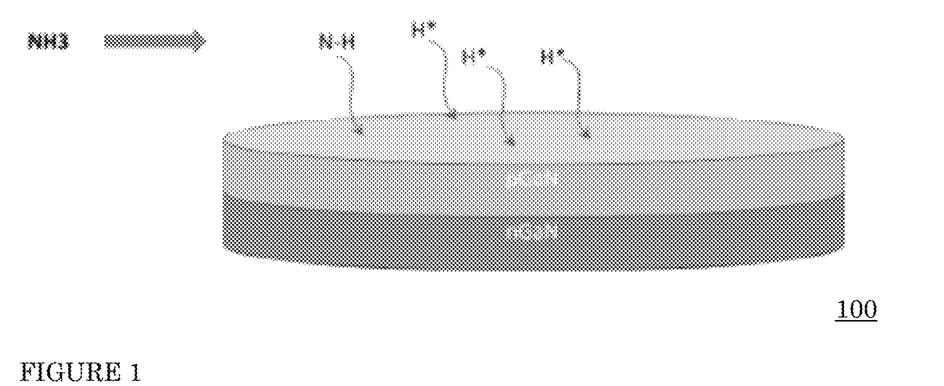
FIG. 1 is an illustrative diagram for growing layers for a device using ammonia as a nitrogen source.
Figure 2:
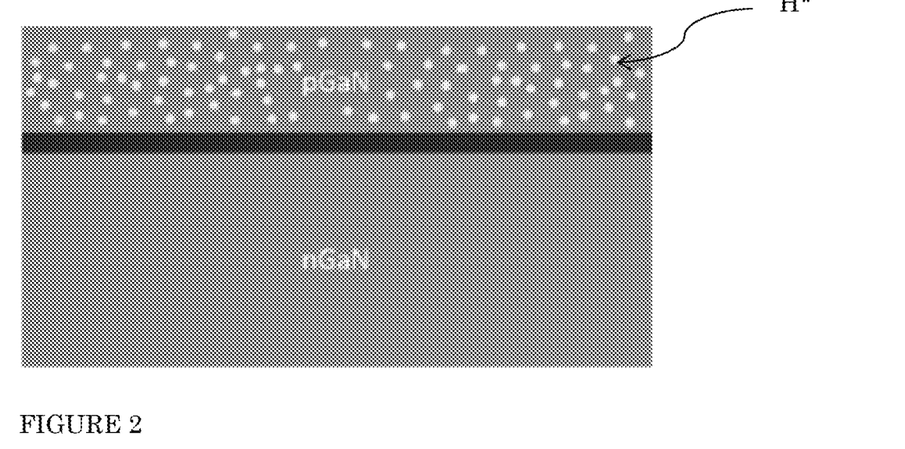
FIG. 2 is an illustrative diagram for growing a device in an ammonia environment.
Figure 3:
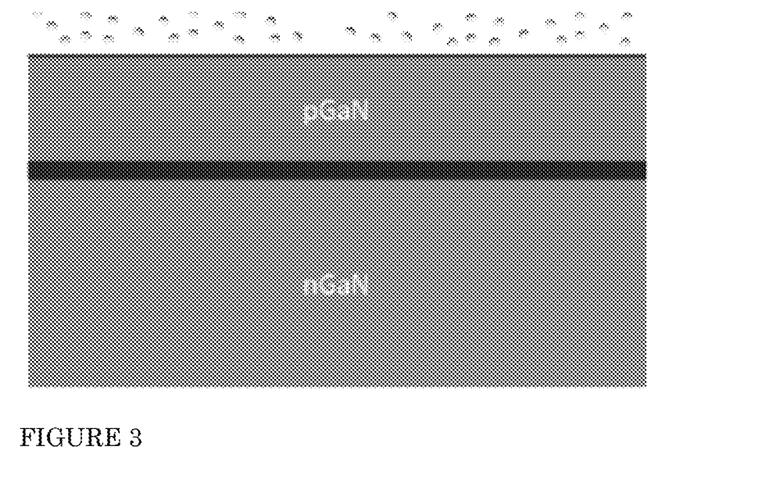
FIG. 3 is an illustrative diagram showing an annealed p-type layer in a device.

However, III-nitride LED grown p-side down device design is limited by the requirement of an anneal in a hydrogen-free atmosphere for p-type layer activation. This is illustrated with reference to FIGS. 1-3. FIG. 1 illustrates a device 100 grown using ammonia ($NH_3$) as the nitrogen source, which results in N and H incorporation into the p-type region (shown as a pGaN layer). FIG. 2 illustrates the presence of hydrogen in the pGaN layer of device 100 that needs to be removed using a hydrogen-free atmosphere annealing process to activate the magnesium (Mg) dopant. FIG. 3 illustrates an annealed device where the hydrogen has diffused out of the pGaN layer. The Mg is now electrically active and functional as a acceptor-type dopant. A nitrogen source based growth process, for example, could be metal-organic chemical vapor deposition (MOCVD). In typical MOCVD, ammonia is used as a nitrogen source, decomposing at the growth temperature into hydrogen radicals and active forms of nitrogen. Even if the carrier gas used is nitrogen, the hydrogen from the ammonia decomposition will form a complex with the Mg during growth.

In the III-nitride LED grown p-side down devices, the p-type region is grown first on the substrate followed by the active region and then the n-type region. Consequently, the p-type region is buried. It has been demonstrated experimentally that hydrogen cannot diffuse through n-type III-nitride materials, and the hydrogen does not readily diffuse laterally over a long distance. In order for the anneal to be effective, the p-type layers cannot be covered by any other layer. Without an effective anneal, the device is left without a p-type layer, or with a p-type layer with an extremely low hole concentration, rendering it useless.

The above issue is also present in III-nitride devices that include a tunnel junction. A tunnel junction is a structure that allows electrons to tunnel from the valence band of a p-type layer to the conduction band of an n-type layer in reverse bias. When an electron tunnels, a hole is left behind in the p-type layer, such that carriers are generated in both layers. Accordingly, in an electronic device like a diode, where only a small leakage current flows in reverse bias, a large current can be carried in reverse bias across a tunnel junction. A tunnel junction requires a particular alignment of the conduction and valence bands at the p/n tunnel junction, which has typically been achieved in other materials systems using very high doping (e.g. p++/n++ junction in the (Al)GaAs material system). III-nitride materials have an inherent polarization that creates an electric field at heterointerfaces between different alloy compositions. This polarization field can be utilized to achieve the required band alignment for tunneling.

As mentioned previously, a tunnel junction allows current to pass through a reverse biased p-n junction, which is otherwise rectifying. This creates the possibility of employing n-type layers, which have much better sheet resistance and hence current spreading, than p-type layers as contact for both the positive and negative terminals of a LED by converting holes from a p-type layer into electrons in an n-type layer via a tunnel junction. It also allows two or more LEDs to be grown on top of one another and connected in series via the tunnel junction. This creates multiple LEDs within the footprint of a single LED, dramatically increasing the optical flux generated per unit area.

In addition to enabling high flux per unit area, tunnel junctions can be used to overcome the efficiency droop. By driving the LEDs connected by the tunnel junction at a lower drive current, each LED can operate at its peak efficiency. Normally this would result in a drop in light output, however by having two or more LEDs connected in series in a given chip area, the light output can be maintained while efficiency is dramatically improved. Thus, all markets can be addressed by a tunnel junction LED, those that require high efficiency and those that require high flux per unit area.

A key limiting factor in creating a tunnel junction in III-nitride LEDs is the activation of the pGaN layer. In the case of a tunnel junction LED, the pGaN layer will be buried, or covered by another layer, as the full device structure is grown. By design, there will be an n-type layer on top of the pGaN layer, with the tunnel junction in between. When the pGaN layer is grown by MOCVD, hydrogen in the reactor forms a chemical complex with Mg (the p-type dopant) in the GaN layer, which renders the Mg electrically inactive. To make the Mg function as a p-type dopant, a post-growth activation anneal is required in a hydrogen-free ambient, where the hydrogen diffuses out of the crystal. However, as described above, hydrogen cannot diffuse through n-type GaN layers. Therefore, when the tunnel junction LED is grown and the pGaN layer is covered by the n-type GaN layer, the activation anneal cannot proceed because the hydrogen will not be able to exit the crystal. This will leave the device without a p-type layer, or with extremely low activation, rendering it useless. This has previously been overcome by growing the p-type layers using molecular beam epitaxy (MBE), which is slow and expensive, and is not typically used in commercial III-Nitride LED manufacturing.

Accordingly, devices with a buried p-type layer, such as a device with a tunnel junction, or a device where the p-type layers are grown before the n-type layers cannot be conventionally grown by MOCVD with ammonia as the nitrogen source.

Described herein are methods for using at least one of RP-CVD and sputtering deposition to grow layers for light emitting devices. In general, RP-CVD and sputtering deposition do not use hydrogen or ammonia during the growth process. That is, layers are grown without a hydrogen-bearing nitrogen precursor. In particular, RP-CVD and sputtering deposition can be used to grow the pGaN layer(s) and/or tunnel junction materials, which can prevent hydrogen from entering the pGaN layer(s) and eliminate the need for post-growth activation of the material is some implementations.

In general, RP-CVD and sputtering deposition allow the use of a hydrogen-free ambient to grow III-nitrides by using nitrogen plasma as the nitrogen source, or using a GaN source target in some sputtering deposition instances, and the pGaN layer(s) would then not require a subsequent activation step. Growth of the tunnel junction and initial part of the subsequent nGaN layer(s) can also be implemented by RP-CVD and/or sputtering deposition, as any introduction of hydrogen into the reactor while the pGaN layer(s) is exposed would result in hydrogen diffusing into the pGaN layer(s) and complexing with the Mg once again. Similarly, for a p-type side down device, the pGaN layer(s) could be grown initially by MOCVD, then in-situ annealed in RP-CVD or sputtering deposition systems, followed by a pGaN layer and an unintentionally doped setback layer grown by RP-CVD and/or sputtering deposition before the active region. The activation anneal, for example, may be performed with an overpressure of active nitrogen generated using the remote plasma source of a RP-CVD reactor. The active region could be grown by a RP-CVD and/or sputtering deposition or by MOCVD if the hydrogen diffusion into the pGaN is not significant.

Figure 4:
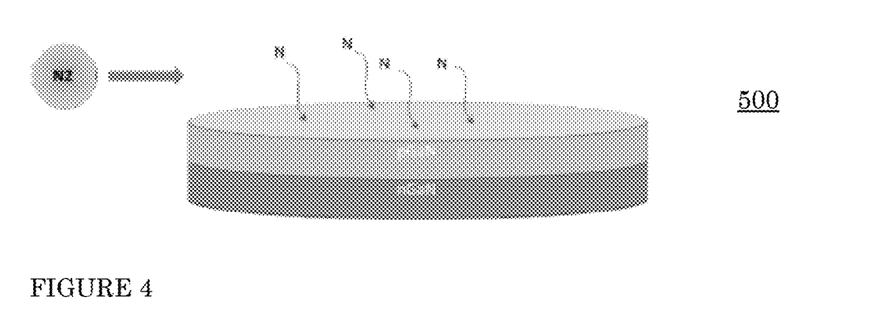
FIG. 4 is an illustrative diagram for growing a device using at least one of RP-CVD and sputtering deposition.

FIG. 4 is an illustrative diagram using RP-CVD and/or sputtering deposition to grow III-nitrides for a device 400. A nitrogen gas source, $N_2$, is used to provide an overpressure of N atoms to prevent desorption of nitrogen from the crystal but with no accompanying hydrogen. As shown, there are no hydrogen atoms in the pGaN layer.

Figure 5:
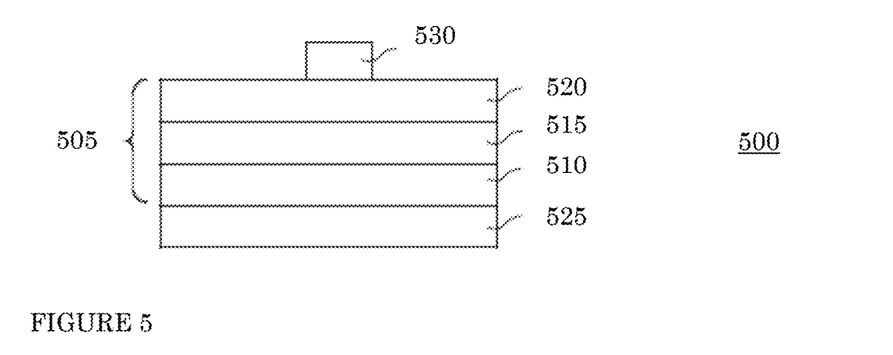
FIG. 5 is an illustrative light emitting diode (LED) in accordance with certain implementations.
Figure 6:
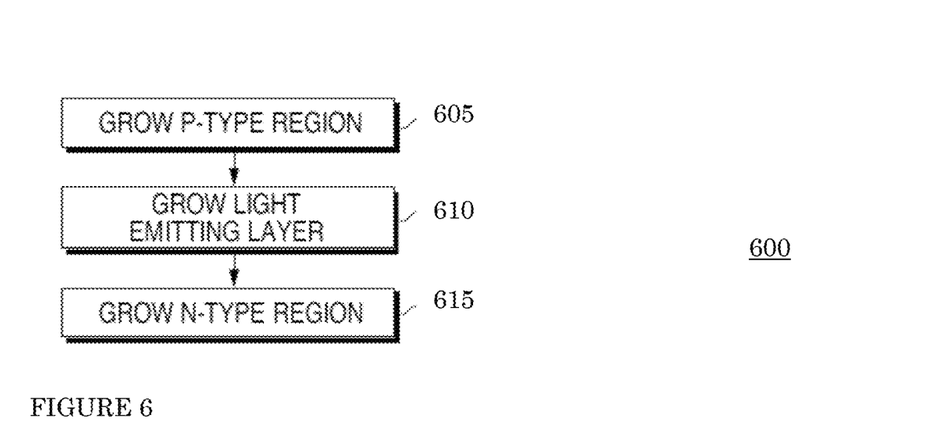
FIG. 6 is an illustrative flow diagram for growing the LED of FIG. 5 using at least one of RP-CVD and sputtering deposition.

FIG. 5 is an illustrative semiconductor structure 505 of a device 500, where a p-type region 510 is grown before a light emitting region 515 and a n-type region 520 as illustrated in flow diagram 600 of FIG. 6. Such a semiconductor structure may be incorporated into any suitable device and implementations are not limited to the device illustrated. Examples of suitable devices as alternatives to the vertical device illustrated include: a flip chip device, where the growth substrate is removed; and a lateral die, where the growth substrate remains and a metal contact is disposed on the first grown doped layer, which is exposed by, for example, dry etching.

Device 500 includes a semiconductor structure 505 grown on a growth substrate (not shown). Semiconductor structure 505 is formed by growing a p-type region 510 first (605), followed by an active or light emitting region 515 including at least one light emitting layer (610), followed by an n-type region 520 (615). A metal p contact 525 is disposed on p-type region 510 and a metal n-contact 530 is disposed on n-type region 520. N-type region 520 may include multiple layers of different compositions and dopant concentration including, for example, n- or even p-type layers designed for particular optical, material, or electrical properties desirable for the light emitting region 515 to efficiently emit light. Light emitting region 515 can include a single thick or thin light emitting layer, or a multiple quantum well light emitting region including multiple thin or thick light emitting layers separated by barrier layers, for example. P-type region 510 can include preparation layers such as buffer layers or nucleation layers, and/or layers designed to facilitate removal of the growth substrate, which may be p-type, n-type, or not intentionally doped, and multiple layers of different composition, thickness, and dopant concentration, including layers that are p-type, not intentionally doped, or n-type, for example.

As stated above, FIG. 6 illustrates a method of forming semiconductor structure 505 for device 500. In an implementation, p-type region 510 is grown first on a growth substrate by using RP-CVD and/or sputtering deposition (605). Light emitting region 515 is then grown over p-type region 510 (610). In an implementation, light emitting region 515 is grown by RP-CVD and/or sputtering deposition, at least for a first part of the growth (such as, for example, at least the first few nanometers), such that the earlier grown p-type region 505 is not exposed to hydrogen. N-type region 520 is grown over p-type region 510 and light emitting region 515 (615) to form semiconductor structure 505.

In some implementations, the growth substrate includes a non-III-nitride substrate such as silicon carbide (SiC) or sapphire and an initial III-nitride structure. The initial III-nitride structure may include, for example, a III-nitride nucleation and/or buffer layer and a thin GaN film on which the semiconductor structure 515 may be grown. The initial III-nitride structure may be grown on the non-III-nitride substrate, for example by MOCVD. In some embodiments, the growth substrate is a pre-formed GaN template, formed by, for example, MOCVD, hydride vapour phase epitaxy (HVPE), liquid phase epitaxy (LPE), ammonothermal, or any other suitable technique.

Referring collectively to FIGS. 5 and 6, p-type region 510 may be grown, for example, by MOCVD followed by an activation anneal performed in a RP-CVD and/or sputtering deposition chamber. In an implementation, after the activation anneal, subsequent growth is performed by RP-CVD and/or sputtering deposition with an n-type region to cap p-type region 510 to prevent reintroduction of hydrogen. Light emitting region 515 and n-type region 520 can be grown by, for example, by RP-CVD, sputtering deposition or MOCVD.

In an implementation, initial growth on an annealed p-type region (for example, the first 2 nanometers (nm) to 100 nm of material) is performed by RP-CVD and/or sputtering deposition with an n-type region to cap p-type region 510 and prevent reintroduction of hydrogen. After p-type region 510 is capped, growth may be switched to MOCVD or other growth techniques.

In an implementation, p-type region 510, light emitting region 515 and n-type region 520 can be grown by RP-CVD and/or sputtering deposition.

In general, once a hydrogen-free p-type region is formed by RP-CVD or sputtering deposition, or MOCVD followed by annealing, the hydrogen-free p-type region must be capped with an n-type region prior to growth by MOCVD in order to prevent introduction or reintroduction of hydrogen.

The above growth techniques are illustrative and combinations of the above described growth techniques for p-type region 510, light emitting region 515 and n-type region 520 are within the scope of the description and claims. After growth, the semiconductor structure may be processed into any suitable device.

Figures 7, 8:
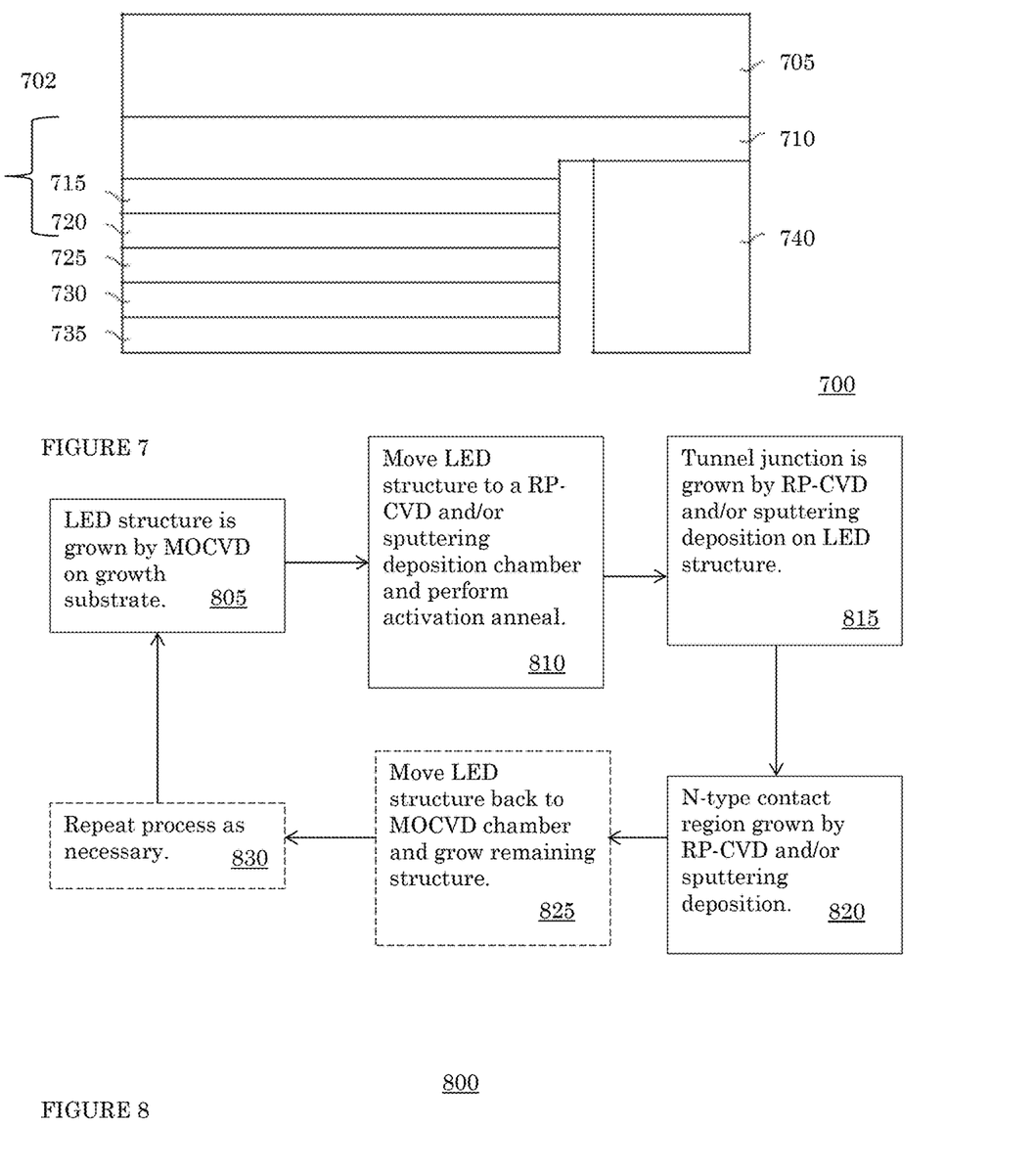
FIG. 7 is an illustrative tunnel junction LED in accordance with certain implementations.
FIG. 8 is an illustrative method for making the tunnel junction LED of FIG. 7 in accordance with certain implementations.

FIG. 7 is an illustrative tunnel junction LED 700 in accordance with certain implementations. In general, a tunnel junction is disposed between the p-type region and a metal contact that injects current into the p-type region. The contact may be formed on an n-type region, which may have much better sheet resistance and hence current spreading as compared to a p-type region. In tunnel junction LED 700, an n-type region is used as contact layers for both the positive and negative terminals of tunnel junction LED 700, by converting holes from the p-type region into electrons in an n-type contact layer via a tunnel junction.

Tunnel junction LED 700 has a LED structure 702 that includes an n-type region 710 grown on a growth substrate 705 followed by a light emitting region 715 and a p-type region 720. N-type region 710 can include multiple layers of different compositions, dopant concentration (including not intentionally doped and/or p-type) and thicknesses. Light emitting region 715 can include, for example, multiple thick or quantum well light emitting layers separated by barrier layers. P-type region 720 can include multiple layers of different compositions, dopant concentration (including not intentionally doped and/or n-type) and thicknesses. A tunnel junction 725 is formed over p-type region 720.

In an implementation, tunnel junction 725 includes a highly doped p-type layer, also referred to as a p++ layer, in direct contact with p-type region 720, and a highly doped n-type layer, also referred to as an n++ layer, in direct contact with the p++ layer. In an implementation, tunnel junction 725 includes a layer of a composition different from the p++ layer and the n++ layer sandwiched between the p++ layer and the n++ layer. In an implementation, tunnel junction 725 includes an InGaN layer sandwiched between the p++ layer and the n++ layer. In an implementation, tunnel junction 725 includes an AlN layer sandwiched between the p++ layer and the n++ layer. Tunnel junction 725 is in direct contact with n-type contact layer 730 as described below.

The p++ layer can be, for example, InGaN or GaN, doped with an acceptor such as Mg or Zn to a concentration of about 1018 $cm^{-3}$ to about 5×1020 $cm^{-3}$. In some embodiments, the p++ layer is doped to a concentration of about 2×1020 $cm^{-3}$ to about 4×1020 $cm^{-3}$. The n++ layer may be, for example, InGaN or GaN, doped with an acceptor such as Si or Ge to a concentration of about 1018 $cm^{-3}$ to about 5×1020 $cm^{-3}$. In an implementation, the n++ layer is doped to a concentration of about 7×1019 $cm^{-3}$ to about 9×1019 $cm^{-3}$. Tunnel junction 725 is usually very thin. For example, tunnel junction 725 can have a total thickness ranging from about 2 nm to about 100 nm, and each of the p++ layer and the n++ layer can have a thickness ranging from about 1 nm to about 50 nm. In an implementation, each of the p++ layer and the n++ layer can have a thickness ranging from about 25 nm to about 35 nm. The p++ layer and the n++ layer may not necessarily be the same thickness. In an implementation, the p++ layer is 15 nm of Mg-doped InGaN and the n++ layer is 30 nm of Si-doped GaN. The p++ layer and the n++ layer may have a graded dopant concentration. For example, a portion of the p++ layer adjacent to the underlying p-type region 720 may have a dopant concentration that is graded from the dopant concentration of the underlying p-type region 720 to the desired dopant concentration in the p++ layer. Similarly, the n++ layer may have a dopant concentration that is graded from a maximum adjacent to the p++ layer to a minimum adjacent to the n-type layer 730 formed over tunnel junction 725. Tunnel junction 725 is fabricated to be thin enough and doped enough such that tunnel junction 725 displays low series voltage drop when conducting current in reverse-biased mode. In an implementation, the voltage drop across tunnel junction 725 is about 0.1V to about 1V.

Implementations including an InGaN or AN or other suitable layer between the p++ layer and the n++ layer may leverage the polarization field in III-nitrides to help align the bands for tunneling. This polarization effect may reduce the doping requirement in the n++ and p++ layers and reduce the tunneling distance required (potentially allowing higher current flow). The composition of the layer between the p++ layer and the n++ layer may be different from the composition of the p++ layer and the n++ layer, and/or may be selected to cause band re-alignment due to the polarization charge that exists between dissimilar materials in the III-nitride material system. Examples of suitable tunnel junctions are described in U.S. Pat. No. 8,039,352 B2, which is incorporated herein by reference.

An n-type contact layer 730 is formed over tunnel junction 725, in direct contact with the n++ layer. First metal contact 735 and second metal contact 740 are formed on n-type contact layer 730 and on n-type region 710, respectively. A mesa may be etched to form a flip chip device, as illustrated in FIG. 7, or any other suitable device structure may be used. First metal contact 735 and second metal contact 740 may be the same or different material, such as aluminum or any suitable contact metal or metals.

In an implementation, the p++ layer of tunnel junction 725 may be in direct contact with light emitting layer 715 such that a separate p-type region 720 is not required.

Growth substrate 705 is often sapphire but may be any suitable substrate such as, for example, SiC, Si, GaN, or a composite substrate. A surface of growth substrate 705 on which a III-nitride semiconductor structure is grown may be patterned, roughened, or textured before growth, which may improve light extraction from tunnel junction LED 700. A surface of growth substrate 705 opposite the growth surface (i.e. the surface through which a majority of light is extracted in a flip chip configuration) may be patterned, roughened or textured before or after growth, which may improve light extraction from tunnel junction LED 700. In an implementation, substrate 705 may be thinned or entirely removed. In an implementation, the surface of substrate 705 exposed by thinning is patterned, textured, or roughened to improve light extraction.

First and second metal contacts 735 and 740 often include multiple conductive layers such as a reflective metal and a guard metal which may prevent or reduce electro-migration of the reflective metal. The reflective metal is often silver, but any suitable material or materials may be used. First and second metal contacts 735 and 740 are electrically isolated from each other by a gap which may be filled with a dielectric such as an oxide of silicon or any other suitable material. Multiple vias to expose portions of n-type region 715 may be formed. First and second metal contacts 735 and 740 are not limited to the arrangement illustrated in FIG. 7. First and second metal contacts 735 and 740 may be redistributed to form bond pads with a dielectric/metal stack, as is known in the art.

In order to form electrical connections to tunnel junction LED 700, one or more interconnects are formed on or electrically connected to first and second metal contacts 735 and 740. The interconnects may be, for example, solder, stud bumps, gold layers, or any other suitable structure.

FIG. 8 is an illustrative method 800 for making tunnel junction LED 700 of FIG. 7 in accordance with certain implementations. N-type region 710, light emitting region 715 and p-type region 720 of LED structure 702 are grown by MOCVD on growth substrate 705 (805). LED structure 702 is then moved to a RP-CVD and/or sputtering deposition chamber, where an activation anneal is done in-situ with an overpressure of active nitrogen (810). In an implementation, an activation anneal is done ex situ before being moved to the RP-CVD and/or sputtering deposition chamber. Tunnel junction 725 is grown on top of LED structure 702 by using at least one of RP-CVD and/or sputtering deposition (815). All or a portion of n-type contact region 730 is grown by RP-CVD and/or sputtering deposition (820). The structure may then be moved back to an MOCVD chamber to grow the remaining structure, where the remaining structure may include a portion of n-type contact region 730 (825). The process may be repeated to form as many LEDs separated by tunnel junctions as desired (830).

In an implementation, tunnel junction 725 does not have to be grown without ambient hydrogen. For example, the p++ layer and first portion of the n++ layer may be grown without ambient hydrogen followed by growth of the remaining n++ layer by MOCVD. In general, as described above, once the p++ layer is capped, growth can take place with hydrogen.

In an implementation, n-type region 710, light emitting region 715, and a first portion of p-type region 720 are grown by MOCVD. The first portion of the p-type region 720 grown by MOCVD may be, for example, at least 1 nm thick and no more than 400 nm thick, at least 5 nm thick and no more than 150 nm thick and at least 10 nm thick and no more than 20 nm thick. The structure is then moved to a RP-CVD and/or sputtering deposition chamber and an activation anneal is done in-situ. A second portion of p-type region 720 is then grown by RP-CVD and/or sputtering deposition. The second portion may be, for example, at least 5 nm thick and no more than 400 nm thick, and at least 10 nm thick and no more than 100 nm thick in some embodiments. The rest of the growth process is as described above.

In an implementation, all III-nitride layers including n-type region 710, light emitting region 715, p-type region 720, tunnel junction 725, and n-type contact region 730 can be grown by RP-CVD and/or sputtering deposition.

In an implementation, tunnel junction LED 900 is grown on growth substrates as described above with respect to FIGS. 4, 5 and 6.

Figure 9:
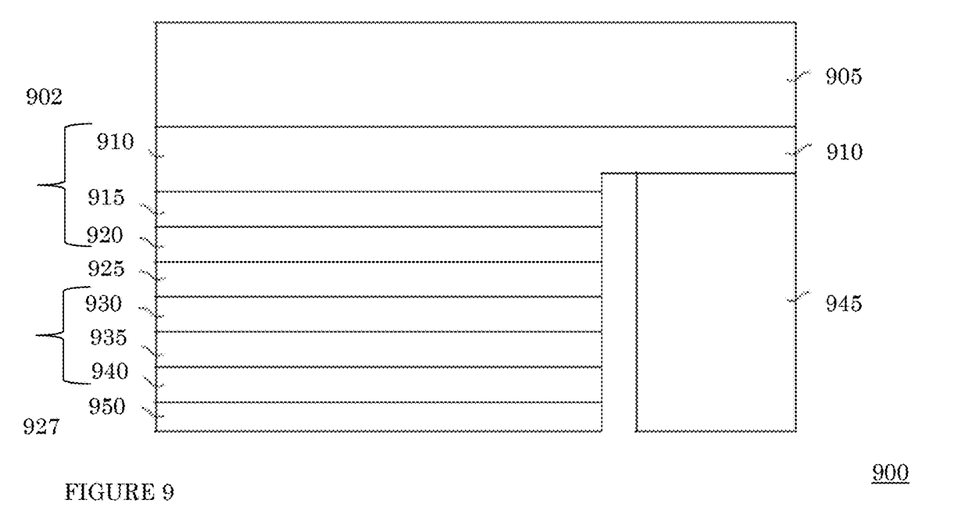
FIG. 9 is another illustrative tunnel junction LED in accordance with certain implementations.

FIG. 9 is another illustrative tunnel junction LED 900 in accordance with certain implementations. In particular, tunnel junction LED 900 includes multiple LEDs that are grown on top of one another and connected in series via a tunnel junction. In general, multiple LEDs are created within the footprint of a single LED, which may dramatically increase the optical flux generated per unit area. In addition, by driving the LEDs connected by a tunnel junction at a lower drive current, each LED can operate at its peak efficiency. In a single LED, this would result in a drop in light output, however by having two or more LEDs connected in series in a given chip area, the light output can be maintained while efficiency is dramatically improved. Thus, tunnel junction LED 900 can be used in applications that require high efficiency and/or applications that require high flux per unit area.

Tunnel junction LED 900 includes a first LED structure 902 that includes an n-type region 910 grown on a growth substrate 905, followed by a light emitting region 915 and a p-type region 920. A tunnel junction 925 is formed over p-type region 920. A second LED structure 927 includes a second n-type region 930, a second light emitting region 935, and a second p-type region 940 are formed over tunnel junction 925. Tunnel junction 925 is oriented such that the p++ layer is in direct contact with p-type region 36 of first LED structure 902 and the n++ layer is in direct contact with n-type region 930 of second LED structure 927. First metal contact 945 and second metal contact 950 are formed on n-type region 910 of first LED structure 902, and on p-type region 940 of second LED structure 927, respectively. A mesa may be etched to form a flip chip device or any other suitable device structure may be used. In an implementation, an additional tunnel junction and n-type layer may be formed over p-type region 940 of second LED structure 927 in order to form second metal contact 950 on an n-type layer. The regions and layers described for tunnel junction LED 900 can have the same materials, properties, features and/or characteristics as those described above for tunnel junction LED 700, as appropriate.

Though two light emitting or active regions are illustrated in FIG. 9, any number of light emitting regions may be included between the two metal contacts provided that the p-type region adjacent each light emitting region is separated from the n-type region adjacent the next active region by a tunnel junction. Since tunnel junction LED 900 has only two contacts, both light emitting regions 915 and 935 emit light at the same time and cannot be individually and separately activated. In an implementation, individual LEDs in the stack may be separately activated by forming additional contacts. In an implementation, a device may have enough tunnel junctions such that the device can operate at a typical line voltage such as, for example, 110 volts, 220 volts, etc.

In an implementation, light emitting regions 915 and 935 may be fabricated with the same composition, such that they emit the same color light, or with different compositions, such that they emit different colors (i.e. different peak wavelengths) of light. For example, a three light emitting region device with two contacts may be fabricated such that the first light emitting region emits red light, the second light emitting region emits blue light, and the third light emitting region emits green light. When activated, the device may produce white light. Since the light emitting regions are stacked such that they appear to emit light from the same area, such devices may avoid problems with color mixing present in a device that combines red, blue, and green light from adjacent, rather than stacked, light emitting regions.

In a device with light emitting regions emitting different wavelengths of light, the light emitting region that generates light of the shortest wavelength may be located closest to the surface from which light is extracted, generally the sapphire, SiC, or GaN growth substrate in an LED. Placement of the shortest wavelength light emitting region near the output surface may minimize loss due to absorption in the quantum wells of the other light emitting regions, and may reduce the thermal impact on more sensitive longer wavelength quantum wells by locating the longer wavelength light emitting regions closer to the heat sink formed by the contacts. The quantum well layers may also be made sufficiently thin so that absorption of light in the quantum well layers is low. The color of the mixed light emitted from the device may be controlled by selecting the number of light emitting regions that emit light of each color. For example, the human eye is very sensitive to green photons and not as sensitive to red photons and blue photons. In order to create balanced white light, a stacked light emitting region device may have a single green light emitting region and multiple blue and red light emitting regions.

Growth substrate 905 is often sapphire but may be any suitable substrate such as, for example, SiC, Si, GaN, or a composite substrate. A surface of growth substrate 905 on which a III-nitride semiconductor structure is grown may be patterned, roughened, or textured before growth, which may improve light extraction from tunnel junction LED 900. A surface of growth substrate 905 opposite the growth surface (i.e. the surface through which a majority of light is extracted in a flip chip configuration) may be patterned, roughened or textured before or after growth, which may improve light extraction from tunnel junction LED 900. In an implementation, substrate 905 may be thinned or entirely removed. In an implementation, the surface of substrate 905 exposed by thinning is patterned, textured, or roughened to improve light extraction.

First and second metal contacts 945 and 950 often include multiple conductive layers such as a reflective metal and a guard metal which may prevent or reduce electro-migration of the reflective metal. The reflective metal is often silver, but any suitable material or materials may be used. First and second metal contacts 945 and 950 are electrically isolated from each other by a gap which may be filled with a dielectric such as an oxide of silicon or any other suitable material. Multiple vias to expose portions of n-type region 910 may be formed. First and second metal contacts 945 and 950 are not limited to the arrangement illustrated in FIG. 9. First and second metal contacts 945 and 950 may be redistributed to form bond pads with a dielectric/metal stack, as is known in the art.

In order to form electrical connections to tunnel junction LED 900, one or more interconnects are formed on or electrically connected to first and second metal contacts 945 and 950. The interconnects may be, for example, solder, stud bumps, gold layers, or any other suitable structure.

Figure 10:
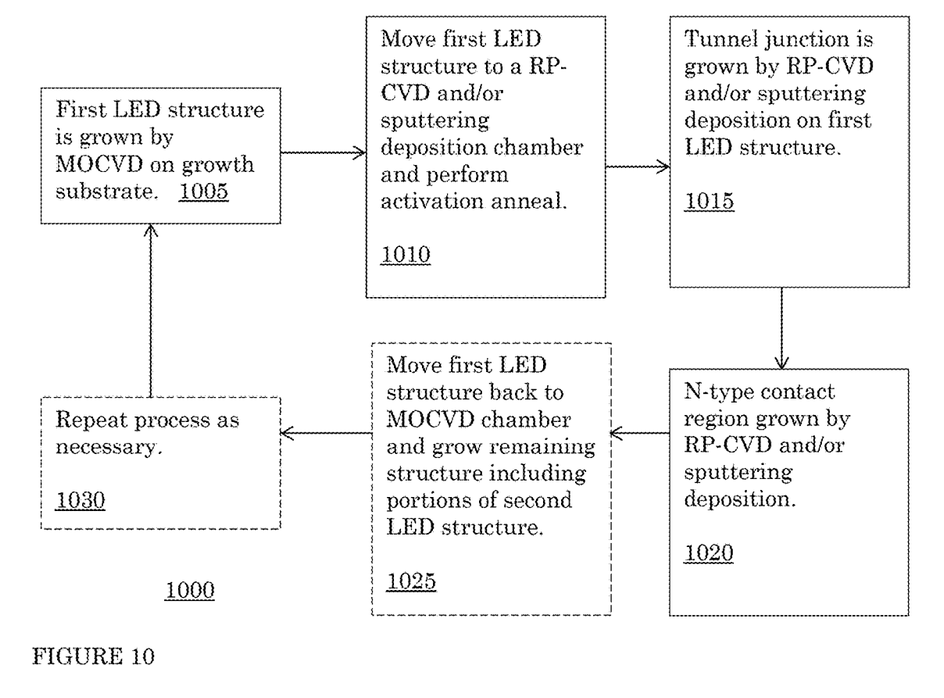
FIG. 10 is an illustrative method for making the tunnel junction LED of FIG. 9 in accordance with certain implementations.

FIG. 10 is an illustrative method for making tunnel junction LED 900 of FIG. 9 in accordance with certain implementations. N-type region 910, light emitting region 915 and p-type region 920 of first LED structure 902 are grown by MOCVD on growth substrate 905 (1005). LED structure 902 is then moved to a RP-CVD and/or sputtering deposition chamber, where an activation anneal is done in-situ with an overpressure of active nitrogen (1010). Tunnel junction 925 is grown on top of first LED structure 902 by using at least RP-CVD and/or sputtering deposition (1015). All or a portion of n-type contact region 930 of second LED structure 923 is grown by RP-CVD and/or sputtering deposition (1020). The structure may then be moved back to an MOCVD chamber to grow the remaining structure, where the remaining structure may include a portion of n-type region 930, light emitting region 935, and p-type region 940 of second LED structure 923 (1025). The process may be repeated to form as many LEDs separated by tunnel junctions as desired (1030).

In an implementation, tunnel junction 925 does not have to be grown without ambient hydrogen. For example, the p++ layer and first portion of the n++ layer may be grown without ambient hydrogen followed by growth of the remaining n++ layer by MOCVD. In general, as described above, once the p++ layer is capped, growth can take place with hydrogen.

In an implementation, n-type region 910, light emitting region 915, and a first portion of p-type region 920 are grown by MOCVD. The first portion of the p-type region 920 grown by MOCVD may be, for example, at least 1 nm thick and no more than 400 nm thick, at least 5 nm thick and no more than 150 nm thick and at least 10 nm thick and no more than 20 nm thick. The structure is then moved to a RP-CVD and/or sputtering deposition chamber and an activation anneal is done in-situ. A second portion of p-type region 920 is then grown by RP-CVD and/or sputtering deposition. The second portion may be, for example, at least 5 nm thick and no more than 400 nm thick and at least 10 nm thick and no more than 100 nm thick in some embodiments. The rest of the growth process is as described above.

In an implementation, all III-nitride layers including n-type region 910, light emitting region 915, p-type region 920, tunnel junction 925, n-type region 930, light emitting region 935 and p-type region 940 can be grown by RP-CVD and/or sputtering deposition.

In an implementation, tunnel junction LED 900 is grown on growth substrates as described above with respect to FIGS. 4, 5 and 6.

Any of the devices described herein may be combined with a wavelength converting structure. The wavelength converting structure may contain one or more wavelength converting materials. The wavelength converting structure may be directly connected to the LED, disposed in close proximity to the LED but not directly connected to the LED, or spaced apart from the LED. The wavelength converting structure may be any suitable structure. The wavelength converting structure may be formed separately from the LED, or formed in situ with the LED. Examples of wavelength converting structures that are formed separately from the LED include ceramic wavelength converting structures that may be formed by sintering or any other suitable process, wavelength converting materials such as powder phosphors that are disposed in transparent material such as silicone or glass that is rolled, cast, or otherwise formed into a sheet, then singulated into individual wavelength converting structures, and wavelength converting materials such as powder phosphors that are disposed in a transparent material such as silicone that is formed into a flexible sheet, which may be laminated or otherwise disposed over an LED.

Examples of wavelength converting structures that are formed in situ include wavelength converting materials such as powder phosphors that are mixed with a transparent material such as silicone and dispensed, screen printed, stenciled, molded, or otherwise disposed over the LED; and wavelength converting materials that are coated on the LED by electrophoretic, vapor, or any other suitable type of deposition.

Multiple forms of wavelength converting structure can be used in a single device. For example, a ceramic wavelength converting member can be combined with a molded wavelength converting member, with the same or different wavelength converting materials in the ceramic and the molded members.

The wavelength converting structure may include, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow emitting wavelength converting materials, and a UV-emitting LED combined with blue-, green-, and red-emitting wavelength converting materials. Wavelength converting materials emitting other colors of light may be added to tailor the spectrum of light extracted from the structure.

In some embodiments, methods described herein may be performed by a cluster tool that moves wafers between an MOCVD chamber and a RP-CVD and/or sputtering deposition chamber. Such a tool allows a scalable manufacturing process. In some embodiments, the RP-CVD, sputtering deposition and MOCVD tools are stand-alone rather than cluster tools. In some embodiments, a single reactor may incorporate RP-CVD and/or sputtering deposition and MOCVD growth modes together in the same physical chamber. It is possible that a very small amount of hydrogen and/or ammonia could be used during growth steps performed by RP-CVD and/or sputtering deposition without deactivating the p-type dopant in a p-type layer, or without impacting the electrical behavior of the p-type region. For example, in some embodiments, hydrogen may be used as a carrier gas for some of the bubblers, assuming it does not cause deactivation of the p-type GaN.

The embodiments described herein may be incorporated into any suitable light emitting device. Embodiments of the invention are not limited to the particular structures illustrated, such as, for example, the vertical devices of FIGS. 5, 7 and 9.

Though in the examples and embodiments described above the semiconductor light emitting device is a III-nitride LED that emits blue or UV light, semiconductor light emitting devices besides LEDs, such as laser diodes, are within the scope of the invention. In addition, the principles described herein may be applicable to semiconductor light emitting devices made from other materials systems such as other III-V materials, III-phosphide, III-arsenide, II-VI materials, ZnO, or Si-based materials.

The non-limiting methods described herein for using RP-CVD and/or sputtering deposition to grow layers in light emitting devices may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the method for using RP-CVD and/or sputtering deposition to grow layers in light emitting devices although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the method for using RP-CVD and/or sputtering deposition to grow layers in light emitting devices described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A method for growing a light emitting device, the method comprising:
    growing a p-type region over a growth substrate by at least one of RP-CVD and sputtering deposition in at least a reduced hydrogen environment that does not cause inoperability of at least the p-type region; and
    growing an n-type region over the p-type region using a non-RP-CVD and non-sputtering deposition process, the p-type region and the n-type region comprising III-nitride materials.

2. The method of claim 1, wherein the growth substrate comprises a non-III nitride material and a GaN film disposed on a non-III nitride material, and the method further comprises growing the GaN film by metal organic chemical vapor deposition (MOCVD).

3. The method of claim 1, wherein the growth substrate comprises a non-III-nitride material, and the method further comprises: growing the GaN film by at least one of RP-CVD and sputtering deposition.

4. The method of claim 1, wherein growing the n-type region over the p-type region comprises growing a portion of the n-type region be at least one of RP-CVD and sputtering deposition.

5. The method of claim 1, wherein growing the n-type region over the p-type region comprises growing the n-type region by MOCVD.

6. A method for growing a light emitting device, the method comprising:
    growing a hydrogen-free p-type region over a growth substrate by at least one of RP-CVD and sputtering deposition;
    growing an n-type region over the p-type region, using a non-RP-CVD and non-sputtering deposition process, the p-type region and the n-type region comprising III-nitride materials.

7. The method of claim 6, wherein the growth substrate comprises a non-III nitride material and a GaN film disposed on a non-III nitride material, and the method further comprises growing the GaN film by metal organic chemical vapor deposition (MOCVD).

8. The method of claim 6, wherein the growth substrate comprises a non-III-nitride material, and the method further comprises: growing the GaN film by at least one of RP-CVD and sputtering deposition.

9. The method of claim 6, wherein growing the n-type region over the p-type region comprises growing a portion of the n-type region be at least one of RP-CVD and sputtering deposition.

10. The method of claim 6, wherein growing the n-type region over the p-type region comprises growing the n-type region by MOCVD.

11. A method for growing a light emitting device, the method comprising:
    growing a p-type region over a growth substrate by at least one of RP-CVD and sputtering deposition in a gaseous environment comprising one or more of a nitrogen-containing gas and a hydrogen-containing gas that does not cause inoperability of at least the p-type region; and
    growing an n-type region over the p-type region using a non-RP-CVD and non-sputtering deposition process, the p-type region and the n-type region comprising III-nitride materials.

12. The method of claim 11, wherein the growth substrate comprises a non-III nitride material and a GaN film disposed on a non-III nitride material, and the method further comprises growing the GaN film by metal organic chemical vapor deposition (MOCVD).

13. The method of claim 11, wherein the growth substrate comprises a non-III-nitride material, and the method further comprises: growing the GaN film by at least one of RP-CVD and sputtering deposition.

14. The method of claim 11, wherein growing the n-type region over the p-type region comprises growing a portion of the n-type region be at least one of RP-CVD and sputtering deposition.

15. The method of claim 11, wherein growing the n-type region over the p-type region comprises growing the n-type region by MOCVD.

* * * * *